United States Patent [19]

Griep et al.

[11] Patent Number: 5,768,285
[45] Date of Patent: Jun. 16, 1998

[54] CIRCUIT FOR EVALUATING BIT ERROR RATE PERFORMANCE OF A DATA DECODER HAVING A VITERBI DETECTOR

[75] Inventors: Karl Robert Griep, Menlo Park; Roy George Batruni, Fremont, both of Calif.

[73] Assignee: National Semiconductor Corporation, Santa Clara, Calif.

[21] Appl. No.: 656,478

[22] Filed: May 31, 1996

[51] Int. Cl.$^6$ .................................................. G06F 11/00
[52] U.S. Cl. ........................... 371/5.1; 371/28; 371/43; 375/262; 375/341
[58] Field of Search ................................ 371/5.1, 28, 43, 371/67.1, 68.1, 68.2; 375/224, 262, 340, 341

[56] References Cited

U.S. PATENT DOCUMENTS

| | | | |
|---|---|---|---|
| 4,375,099 | 2/1983 | Waters et al. | 371/6 |
| 4,675,871 | 6/1987 | Gardon et al. | 371/46 |
| 5,323,421 | 6/1994 | LaRosa et al. | 375/10 |
| 5,325,397 | 6/1994 | Scholz et al. | 375/10 |
| 5,341,386 | 8/1994 | Shimoda et al. | 371/43 |
| 5,351,245 | 9/1994 | Pregont et al. | 371/5.1 |
| 5,406,562 | 4/1995 | Roney, IV | 371/5.1 |
| 5,430,744 | 7/1995 | Fettweis et al. | 371/43 |
| 5,430,768 | 7/1995 | Minuhin et al. | 375/340 |
| 5,600,664 | 2/1997 | Hayashi | 371/43 |

OTHER PUBLICATIONS

Ron Wilson, Design, "Implementation Questions Hound PRML", Electronic Engineering Times, Apr. 18, 1994.

Roy D. Cideciyan, Francois Dolivo, Reto Hermann, Walter Hirt and Wolfgang Schott, "A PRML System for Digital Magnetic Recording", IEEE Journal on Selected Areas in Communications, vol. 10, No. 1, Jan. 1992, pp. 38–56.

Tim Perkins and Zachary A. Keirn, "A Window–Margin–Like Procedure for Evaluating PRML Channel Performance", IEEE Transactions on Magnetics, vol. 31, No. 2, Mar. 1995, pp. 1109–1114.

H.K. Thapar and A.M. Patel, "A Class of Partial Response Systems for Increasing Storage Density in Magnetic Recording", IEEE Transactions on Magnetics, vol. MAG-23, No. 5, Sep. 1987, pp. 3666–3668.

H. Kobayashi, "Application of Probabilistic Decoding to Digital Magnetic Recording Systems", Jan. 1971, pp. 64–74, IBM J. Res. Development.

G. David Forney, Jr., "The Viterbi Algorithm", Proceedings of the IEEE, vol. 61, No. 3, Mar. 1973, pp. 268–278.

*Primary Examiner*—Robert W. Beausoliel, Jr.
*Assistant Examiner*—Trinh L. Tu
*Attorney, Agent, or Firm*—Limbach & Limbach L.L.P.

[57] ABSTRACT

An evaluation circuit for use in evaluating the bit error rate (BER) performance of a Viterbi detector based upon a computation of its amplitude error margin (AEM) includes two threshold comparison circuits and an AEM computation circuit. Each threshold comparison circuit receives and compares a Viterbi signal from a Viterbi detector and one or two AEM threshold signals and in accordance therewith generates a comparison signal. The Viterbi signals represent combinations of signals which include the sum of and difference between the Viterbi difference metric and slicer threshold signals associated with the Viterbi detector. The AEM threshold signals correspond to probabilities that the two Viterbi signals have magnitudes which exceed some predetermined values. The AEM computation circuit receives a control signal from the Viterbi detector and the two comparison signals and computes an AEM parameter which corresponds to one of the Viterbi signals. In one embodiment: each threshold comparison circuit includes a converter which converts the Viterbi signal to an absolute value signal representing the absolute value of the Viterbi signal, a comparator which compares the absolute value signal with an AEM threshold signal, and a shift register which receives and time-delays the comparator output signal to generate the comparison signal; and the AEM computation circuit includes a multiplexor which selects between the comparison signals in accordance with the control signal, and a counter which counts the signal transitions of the selected comparison signal. The counter output represents the AEM of the Viterbi detector.

34 Claims, 11 Drawing Sheets

CIRCUIT FOR EVALUATING BIT ERROR RATE PERFORMANCE OF A DATA DECODER HAVING A VITERBI DETECTOR

BACKGROUND OF THE INVENTION

1. Field of the Invention

The present invention relates to data decoders having Viterbi detectors, and in particular, to circuits for evaluating the bit error rate performance of a partial response, maximum likelihood (PRML) decoder.

2. Description of the Related Art

In synchronous data channels, particularly those used in telecommunications and magnetic data recording (e.g. disk drives) data recovery in the receiver is often performed with an equalizer or a Viterbi detector, or a combination of both. For those systems having an equalizer but no Viterbi detector, the bit error rate (BER) can generally be inferred from the calculation of the signal-to-noise ratio (SNR) at the output of the equalizer and the input of the data quantizer or slicer. However, when a Viterbi detector is used, either alone or in conjunction with an equalizer, the SNR at the input of the Viterbi detector is generally not sufficiently indicative of the BER since the system noise is generally not uncorrelated and gaussian (due to fixed-point representation, filtering, inter-symbol interference and nonlinearities within the system). Rather, in order to qualitatively evaluate (and, under some circumstances, quantitatively predict) the BER, statistics have to be computed about the Euclidean distance between the correct branch at a time n and the closest competing branch. This distance, referred to as the amplitude error margin (AEM), is the distance between the current Viterbi Decision Metric $M_n$ and the decision boundary which when crossed causes elimination of the correct path through the trellis (discussed in more detail below) as a result of an error event (one or more errors in the recovered information sequence) and represents the amount of additional amplitude error which can be tolerated by the Viterbi detector prior to such path elimination. From such statistics, one can determine the nature of the probability density of the AEM and, consequently, the probability of a decoding error, i.e. the BER.

With the AEM at a time n defined as $\gamma_n$, an error event will occur if and only if the AEM is greater than zero:

$$\gamma_n < 0 \tag{1}$$

Multiplying both sides by $-1$, the equivalent representation is:

$$-\gamma_n > 0 \tag{2}$$

Substituting a more general K for zero, an error event is defined to occur if and only if:

$$-\gamma_n > K \tag{3}$$

Referring to FIG. 1A, under normal conditions K=0 and the error rate is low. However, referring to FIG. 1B, decreasing the threshold K increases the probability of an error event being induced.

Referring to FIG. 2A, a Viterbi detector in a digital PR4 PRML decoder processes its input signals on the basis of a separate two-state trellis. Designators $a_n$ and $a_{n-2}$ are the amplitude modulated data sequence that represent the input signal. Designator $d_n$ is the update to the Viterbi metric for following a particular path through the trellis. Designator $x_n$ is the noiseless output of a data channel for following a path (i.e. $x_n = a_n - a_{n-2}$). Designator $b_n$ represents the original data bit corresponding to each transition. Designators $J_n(+1)$ and $J_n(-1)$ represent the Viterbi metric for each state at time n. The difference between the two Viterbi metrics is defined as:

$$\Delta J_n = \frac{1}{2}(J_n(+1) - J_n(-1)) \tag{4}$$

The determination as to which paths survive at each transition in the trellis is made based upon the current signal sample $y_n$ and the past Viterbi difference metric $\Delta J_{n-2}$. Such decision is based upon the value of the decision metric $M_n$:

$$M_n = \Delta J_{n-2} - y_n \tag{5}$$

The update of the Viterbi difference metric $\Delta J_n$ and the survivor paths for the three possible ranges of the decision metric $M_n$ for a given adaptive threshold slicer t are defined as follows:

$$\begin{aligned}
&y_n + t, & \text{if} \quad +t \leq M_n & \quad \text{(Paths 1 \& 2)} \\
\Delta J_n = &\Delta J_{n-2}, & \text{if} \quad -t < M_n < +t & \quad \text{(Paths 1 \& 4)} \\
&y_n - t, & \text{if} \quad M_n \leq -t & \quad \text{(Paths 3 \& 4)}
\end{aligned} \tag{6}$$

(where t is the adaptive threshold slicer used to reduce the number of multiplications required to implement the adaptive equalizer).

Based upon Equation 6, it can be seen that, in terms of possible survivor paths, three cases exist: Case 1: paths 1 and 2; Case 2: paths 1 and 4; and Case 3: paths 3 and 4. When the true path is not chosen at a particular state transition, i.e. the correct path through the trellis is eliminated, this results in a fundamental error event in a PRML system.

Referring to FIG. 2B, example waveforms in accordance with the foregoing discussion are shown. Graph (A) is the trellis diagram of the receipt sequence, with the heavy solid line showing the correct path through the trellis. Graph (B) is the Viterbi decision metric $M_n$. Graph (C) is the output $y_n$ of the adaptive equalizer. Graph (D) is the Viterbi difference metric $\Delta J_n$. As can be seen in Graph (B), interference, noise, and/or inter-symbol interference have corrupted the Viterbi decision metric $M_n$ during time period 8, thereby causing a merger to occur when the transmitted data bit was actually a 0.

Referring to FIG. 3A, the two possible choices of AEM for Case 1 (where $+t \leq M_n$) are as shown. The designator $\gamma_n$ is used to identify an initial guess as to the AEM at each transition of states. This initial guess $\gamma_n$ is updated in accordance with the occurrence of the next merger in the trellis so as to produce the final AEM value $\gamma_n$. For Case 1 where $M_n \geq +t$, paths 1 and 2 are chosen as the most likely paths into states 0 and 1, respectively (FIG. 2A). An initial guess is made, thereby assigning an initial value to $\gamma_n$. In accordance with the next merger in the trellis, $\gamma_n$ is then modified to produce the true AEM value $\gamma_n$. For example, if the next merger occurs at time $2i$ later ($1 \leq i \leq 6$) and $M_{n+2i} \geq +t$, then path 1 is the correct path for the transition from time n−2 to n and $\gamma_n = \gamma_n + 2t$. However, if $M_{n+2i} \leq -t$, then path 2 is the correct path and $\gamma_n = \gamma_n$.

Referring to FIG. 3B, the two possible choices of AEM for Case 2 (where $-t < M_n < +t$) are as shown. In this case, paths 1 and 4 are chosen as the most likely paths into states 0 and 1, respectively. An initial guess is made and $\gamma_n$ is assigned an initial value. If $M_{n+2i} \geq +t$, path 1 is the correct path and $\gamma_n = \gamma_n + 2t$. If $M_{n+2i} \leq -t$, path 4 is the correct path and $\gamma_n = |\gamma_n|$.

Referring to FIG. 3C, the two possible choices of AEM for Case 3 (where $M_n \leq -t$) are as shown. In this case, paths 3 and 4 are chosen as the most likely paths into states 0 and 1, respectively. As in the other cases, an initial guess is made and $\gamma_n$ is assigned an initial value. If $M_{n+2i} \geq +t$, path 3 is the correct path and $\gamma_n = |\gamma_n + 2t|$. If $M_{n+2i} \leq -t$, path 4 is the correct path and $\gamma_n = |\gamma_n|$.

From the foregoing discussion, it can be seen that the AEM can be computed with the same hardware regardless of the paths which are involved. With a simple generalization of the foregoing three cases, the AEM can be computed in the same manner for every state transition by taking the absolute value of the final update for every case. Implementation of the updating of $\gamma_n$ is done by using estimator signals $b_n^+$ and $b_n^-$ (FIG. 2A) where $b_n^-$ indicates when a merger occurs and $b_n^+$ indicates whether the trellis has merged to state 0 or state 1.

Referring to FIG. 4, a conventional circuit implementation for determining the AEM is as shown. The Viterbi slicer threshold $t_n$ is differentially summed with the Viterbi decision metric $M_n$, and the result thereof is time delayed for six time units and differentially summed with a multiple of two times the Viterbi slicer threshold. A switch, in accordance with a switch control signal $S_n$ (discussed in more detail below), selects between this last differential sum and the previous time delayed sum. The absolute value is then taken of the selected signal and compared against a threshold $K_i$ which defines the statistic being evaluated.

The threshold $K_i$ is the induced error threshold. As the threshold $K_i$ is made more negative, the probability of an error being induced increases. With an increased probability of induced error(s), fewer simulation bits are needed to obtain a low variability estimate of such probability. By performing a number of simulations with different threshold $K_i$ values, the shape of the AEM probability distribution (e.g. FIGS. 1A and 1B) can be approximated, thereby providing a metric for use in making qualitative comparisons of different systems.

One of the shortcomings to the circuit implementation of FIG. 4, however, involves the time delay unit in which the differential sum of the Viterbi slicer threshold $t_n$ and Viterbi decision metric $M_n$ is time delayed for six time units. Where such a summation signal is a multiple-bit digital signal, a relatively significant amount of circuitry and, therefore, integrated circuit area, is required to implement this time delay element since a large time delay for a large bitwidth word requires a large number of large registers. For example, if the signal representing the differential sum of the Viterbi slicer threshold $t_n$ and Viterbi decision metric $M_n$ were eight bits wide, the time delay element must necessarily be eight bits wide and six bits deep.

SUMMARY OF THE INVENTION

In accordance with one embodiment of the present invention, an evaluation circuit for use in evaluating the bit error rate (BER) performance of a decoder with a Viterbi detector based upon a computation of its amplitude error margin (AEM) includes two threshold comparison circuits and a computation circuit. The first threshold comparison circuit is configured to receive and compare a first Viterbi signal and at least one AEM threshold signal and in accordance therewith generate a first comparison signal. The first Viterbi signal represents a first combination of signals which includes a sum of a Viterbi difference metric signal and a Viterbi slicer threshold signal associated with a Viterbi detector. The second threshold comparison circuit is configured to receive and compare a second Viterbi signal and the at least one AEM threshold signal and in accordance therewith generate a second comparison signal. The second Viterbi signal represents a second combination of signals which includes a difference between the Viterbi difference metric signal and Viterbi slicer threshold signal. The at least one AEM threshold signal corresponds to first and second probabilities that the first and second Viterbi signals have magnitudes which exceed first and second predetermined values, respectively. The computation circuit is coupled to the first and second threshold comparison circuits and is configured to receive a control signal and the first and second comparison signals and in accordance therewith compute at least one AEM parameter corresponding to at least one of the first and second Viterbi signals.

These and other features and advantages of the present invention will be understood upon consideration of the following detailed description of the invention and the accompanying drawings.

DETAILED DESCRIPTION OF THE INVENTION

Figure 5:
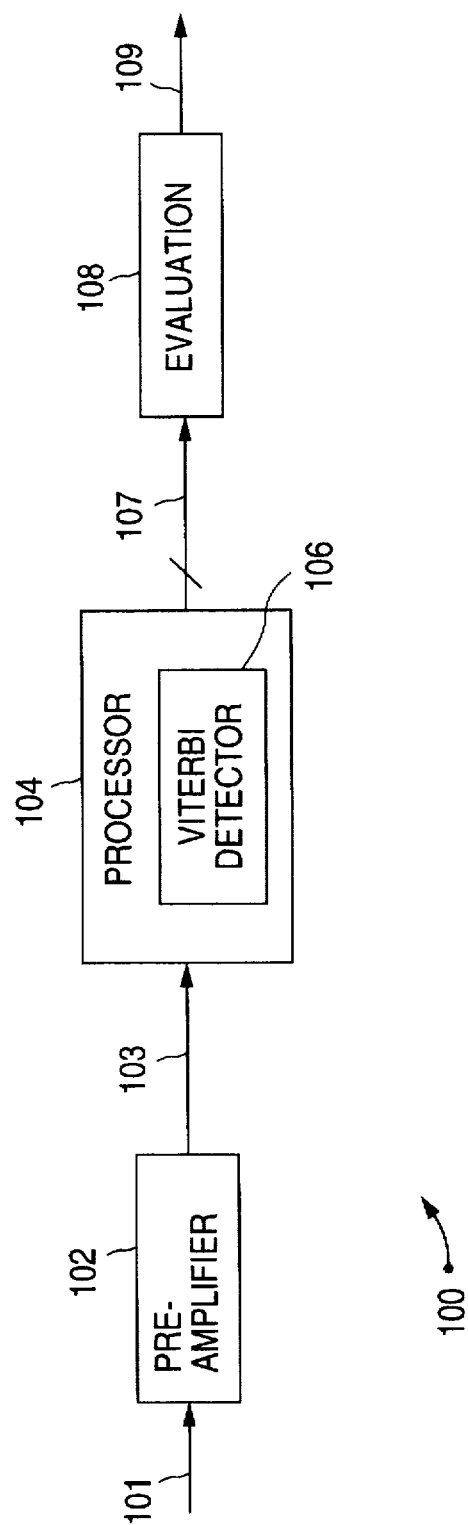
FIG. 5 is a functional block diagram of a PRML decoder with a Viterbi detector using an evaluation circuit for evaluating the BER performance based upon a computation of AEM in accordance with the present invention.

Referring to FIG. 5, in accordance with one embodiment of the present invention, a PRML decoder including an evaluation circuit for use in evaluating its BER performance based upon a computation of its AEM includes a preamplifier 102, a processor 104 which includes a Viterbi detector 106, and an evaluation circuit 108. The incoming signal 101 is preamplified by the preamplifier 102. The preamplified signal 103 is then processed by the processor 104 in accordance with well-known conventional techniques. A set 107 of processed signals is then used by the evaluation circuit 108 to generate an evaluation signal 109 for use in qualitatively evaluating and, under some circumstances, estimating the BER performance of the system, as well as making qualitative comparisons between different decoder systems.

Figure 6A:
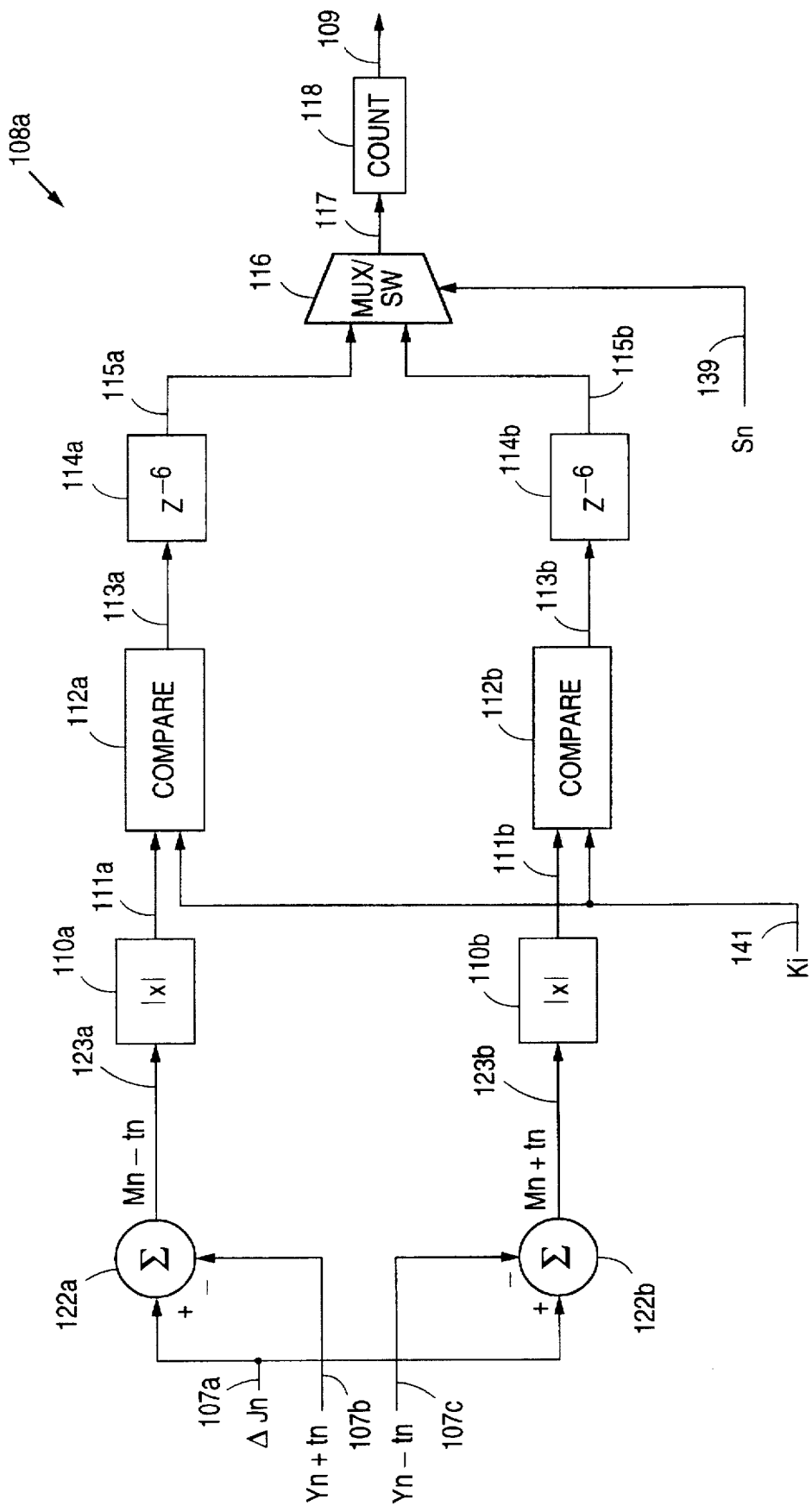
FIG. 6A is a functional block diagram of an evaluation circuit in accordance with one embodiment of the present invention.

Referring to FIG. 6A, in accordance with one embodiment of the present invention, an evaluation circuit 108a for use in evaluating the BER performance of a decoder with a Viterbi detector based upon a computation of its AEM includes a pair of signal summing circuits 122a, 122b, a pair of absolute value circuits 110a, 110b, a pair of comparison circuits 112a, 112b (e.g. comparators), a pair of time delay elements 114a, 114b (e.g. shift registers), a signal selector (e.g. multiplexor or switch) 116 and a counter 118, all interconnected substantially as shown. The input signals include three Viterbi signals 107a, 107b, 107c which are generated in the Viterbi detector 106 and represent the Viterbi difference metric $\Delta J_n$ (107a) and the sum of (107b) and difference between (107c) the current signal sample $y_n$ and Viterbi slicer threshold $t_n$. The difference metric 107a and sample/threshold sum 107b signals are differentially summed by the first signal summing circuit 122a and the difference metric 107a and sample/threshold difference 107b signals are differentially summed by the second signal summing circuit 122b to provide two further Viterbi signals 123a, 123b which represent the difference between and the sum of the Viterbi decision metric $M_n$ and Viterbi slicer threshold $t_n$, respectively.

Figure 2A:
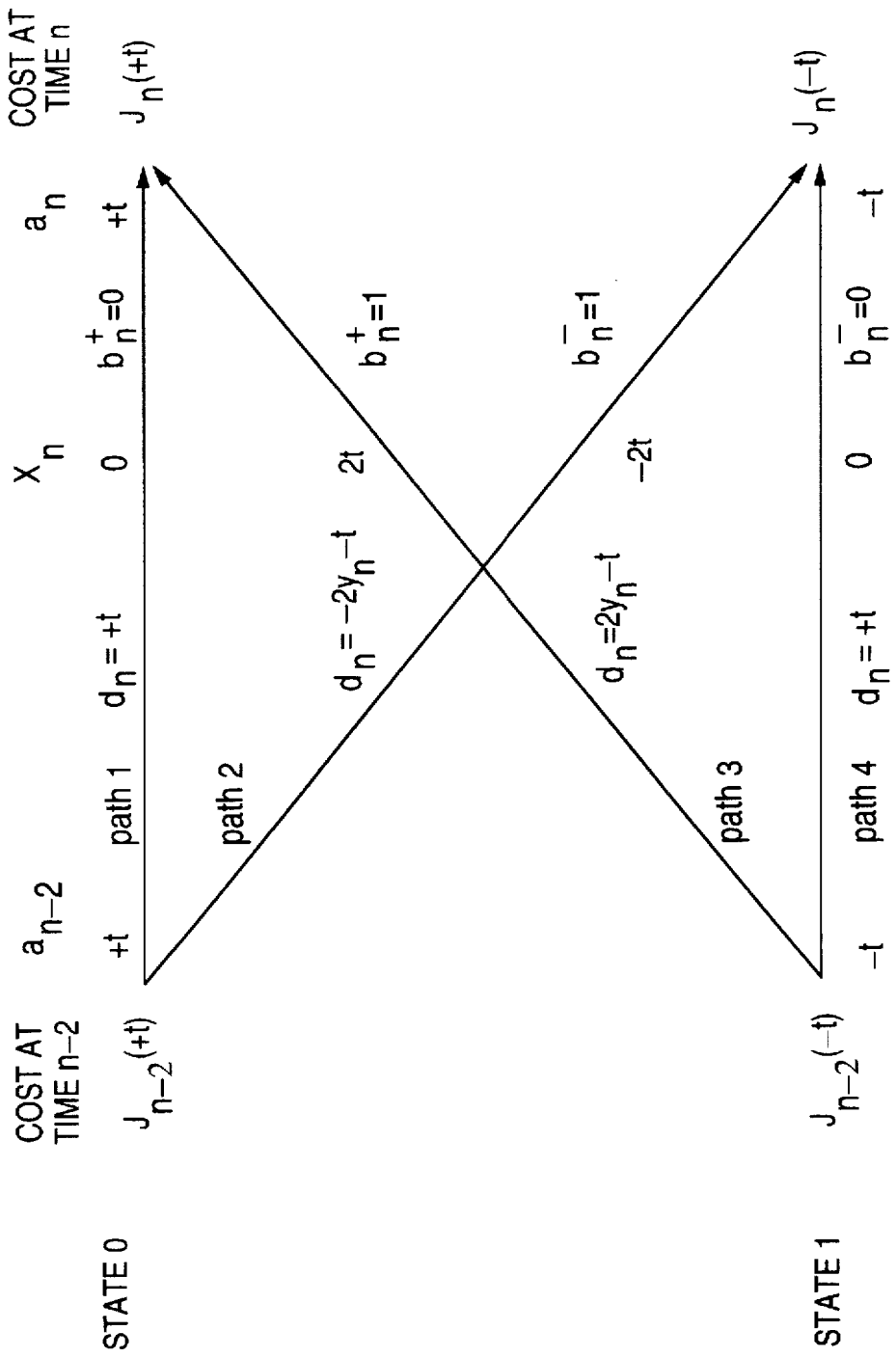
FIG. 2A is a state diagram for a conventional Viterbi detector for use in a PRML decoder.
Figure 2B:
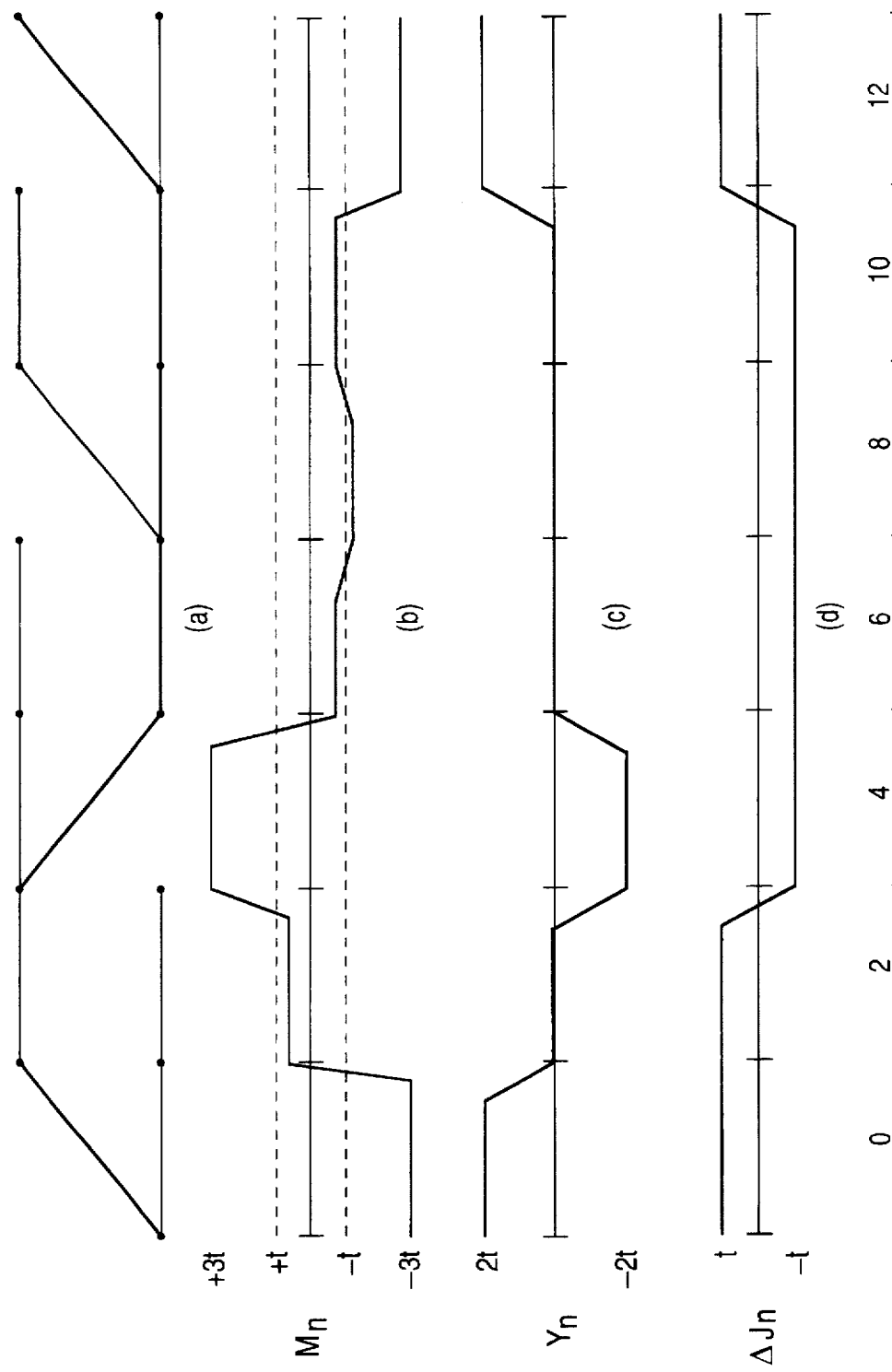
FIG. 2B illustrates example waveforms of a conventional PRML decoder using a Viterbi detector.
Figure 3A:
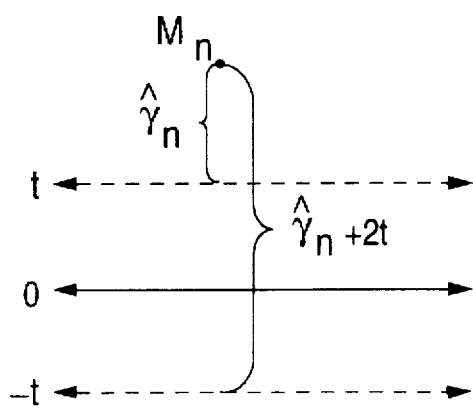
FIGS. 3A, 3B and 3C illustrate three cases for determining survivor paths in a state transition trellis for a conventional Viterbi detector.
Figure 3B:
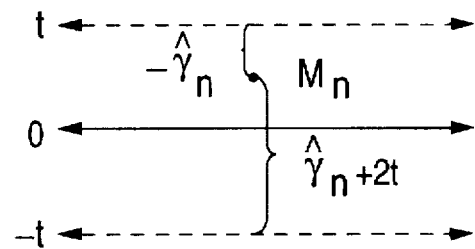
Figure 3C:
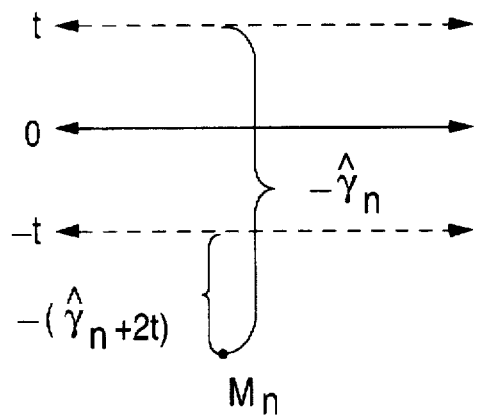
Figure 4:
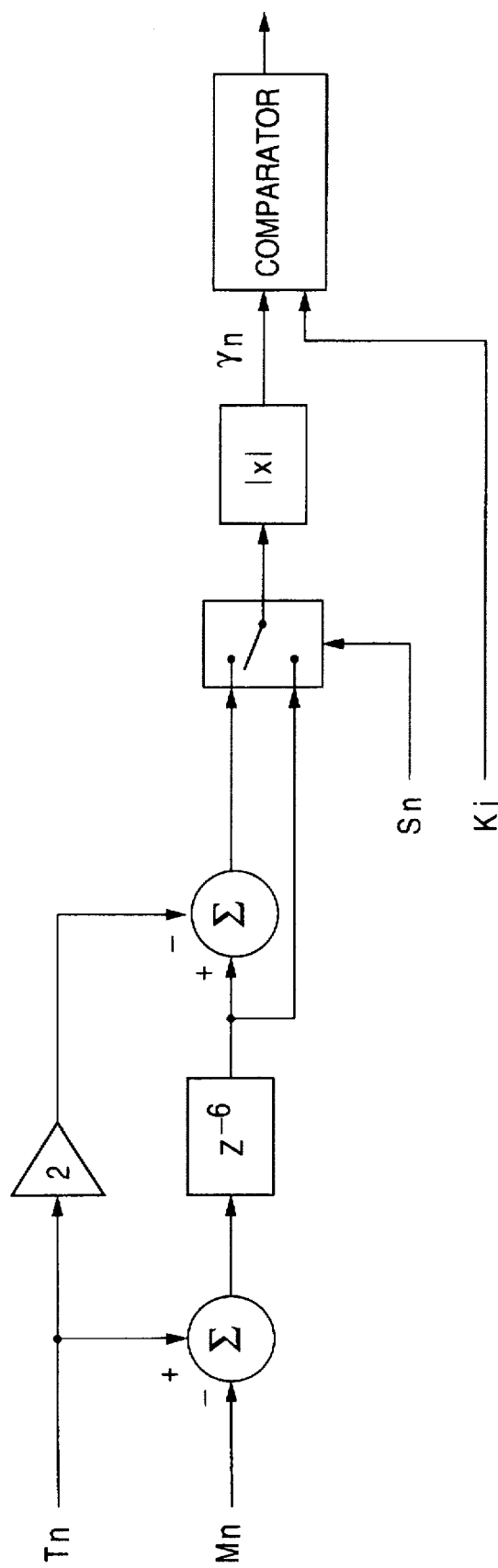
FIG. 4 is a conventional circuit implementation of an evaluation circuit for evaluating the AEM statistics of a PRML decoder using a Viterbi detector.

The absolute value of each of the Viterbi decision metric and slicer threshold difference 123a and sum 123b signals is determined by its respective absolute value circuit 110a, 110b, and the results 111a, 111b thereof are compared in their respective comparison circuits 112a, 112b with the user-defined threshold $K_i$ signal 141 which defines the statistic to be evaluated. The results 113a, 113b of such comparison, each of which is one bit wide, are then time delayed by the time delay elements 114a, 114b. Since each of the comparison result signals 113a, 113b is only one bit wide, these time delay elements 114a, 114b need only be one bit wide and six bits deep. One of the resulting time delayed signals 115a, 115b is then selected by the signal selector 116 in accordance with a control signal $S_n$ 139. As discussed in more detail below, this control signal 139 is generated based upon post-merger information provided by the Viterbi detector 106 within the processor 104 as a function of estimator signals $b_n^+$ and $b_n^-$ (FIG. 2A) ($S_n = f\{b_n^+, b_n^-\}$) and identifies whether the upper or lower circuit path of the evaluation circuit 108a is to be used, i.e. whether path 1, 2, 3 or 4 of the Viterbi state transition trellis was determined to be the correct path through the trellis.

Figure 1A:
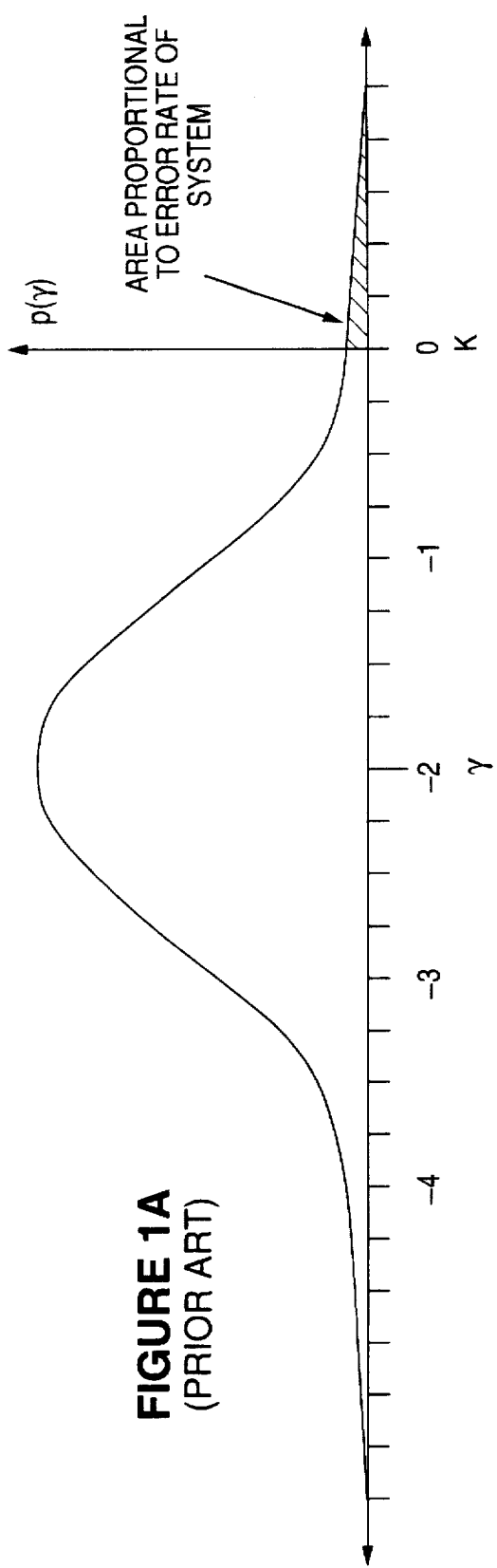
FIGS. 1A and 1B illustrate example BER probability curves for conventional PRML decoders.
Figure 1B:
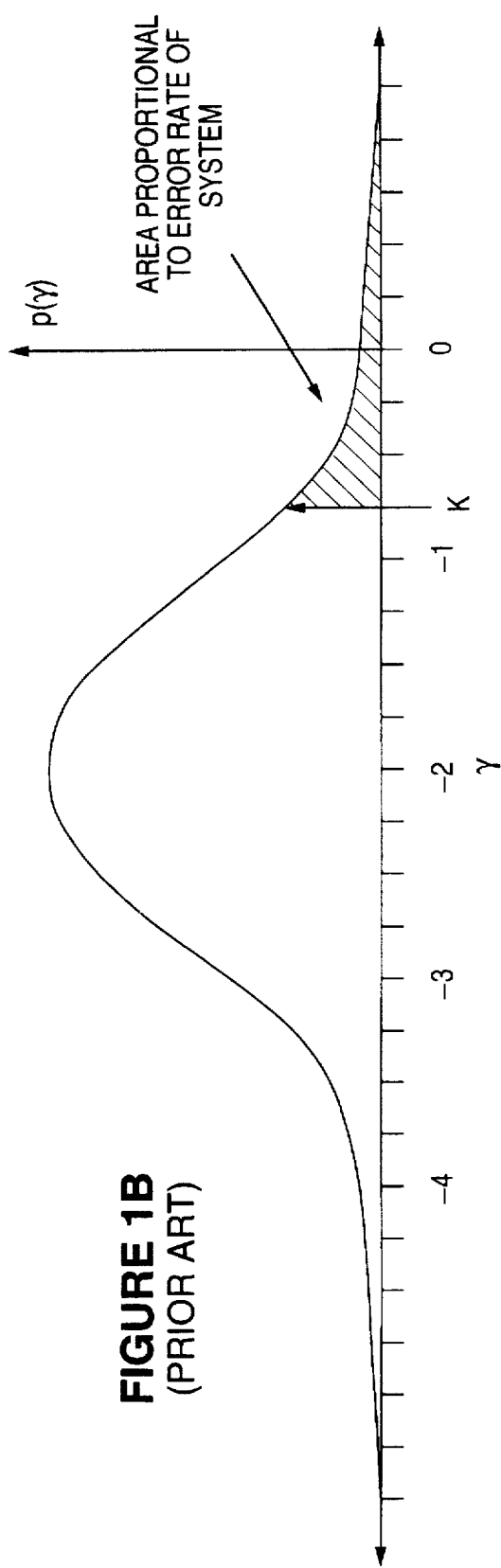

The selected signal 117 is then counted by the counter 118 to determine the AEM statistics of the decoder, generating one count each time the absolute value of the selected incoming Viterbi signal 105c/105d exceeds the statistic threshold $K_i$. By averaging the output count signal 109 over time, the approximate area under the probability curve (FIGS. 1A and 1B) and, therefore, the cumulative distribution function for the AEM can be approximated, thereby providing a parameter for qualitative evaluation of the BER performance and, under those circumstances where its relationship to the AEM is better known, providing a parameter with which the BER performance of the decoder 100 can be estimated.

Figure 6B:
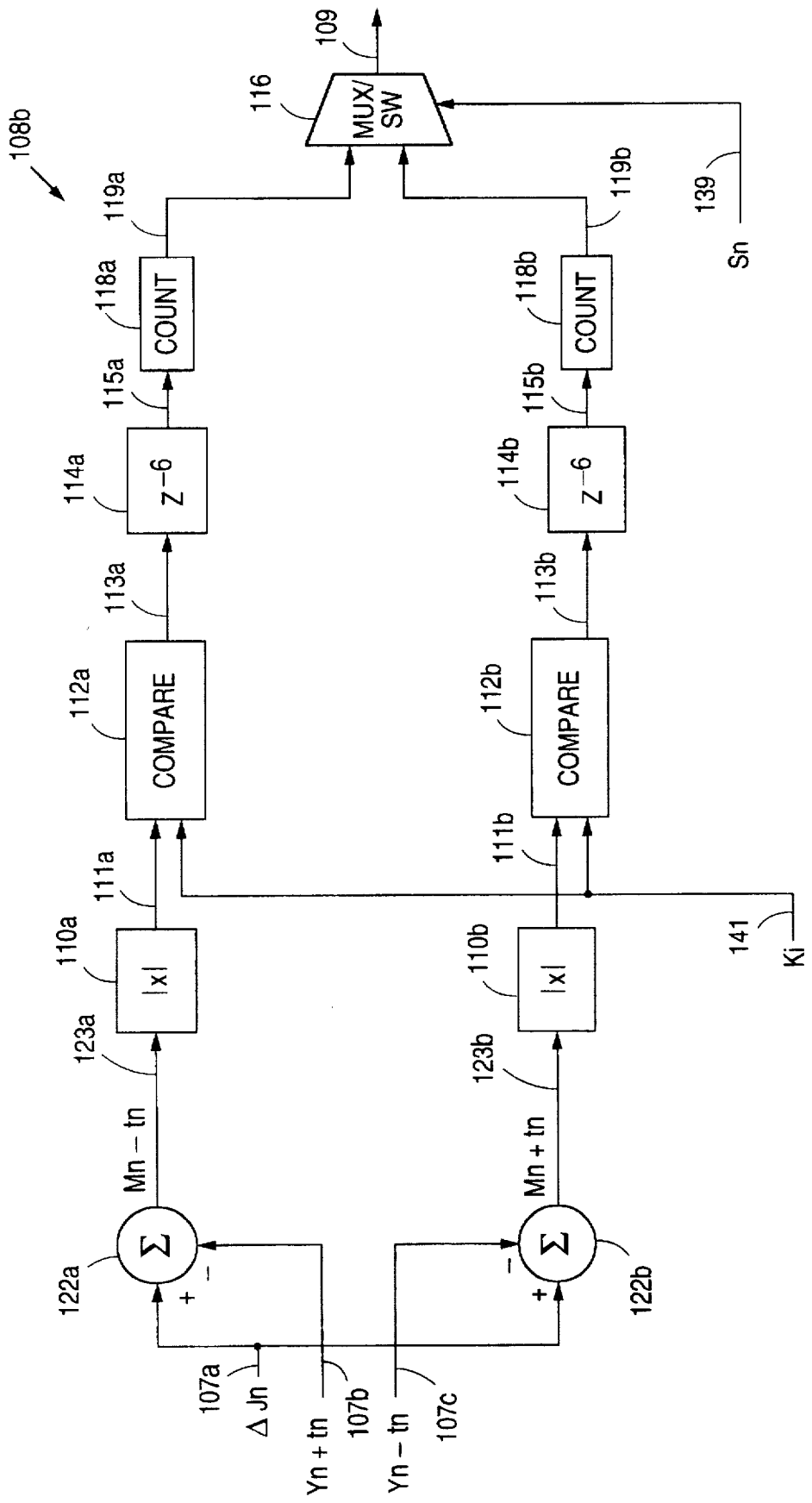
FIG. 6B is a functional block diagram of an evaluation circuit in accordance with another embodiment of the present invention.

Referring to FIG. 6B, an evaluation circuit 108b in accordance with another embodiment of the present invention includes, in accordance with the foregoing discussion, the signal summing circuits 122a, 122b, absolute value circuits 110a, 110b, comparison circuits 112a, 112b and time delay elements 114a, 114b, but uses two counters 118a, 118b prior to the signal selector 116. Hence, in accordance with the control signal 139, the signal selector 116 selects one of the two count signals 119a, 119b.

Figure 7A:
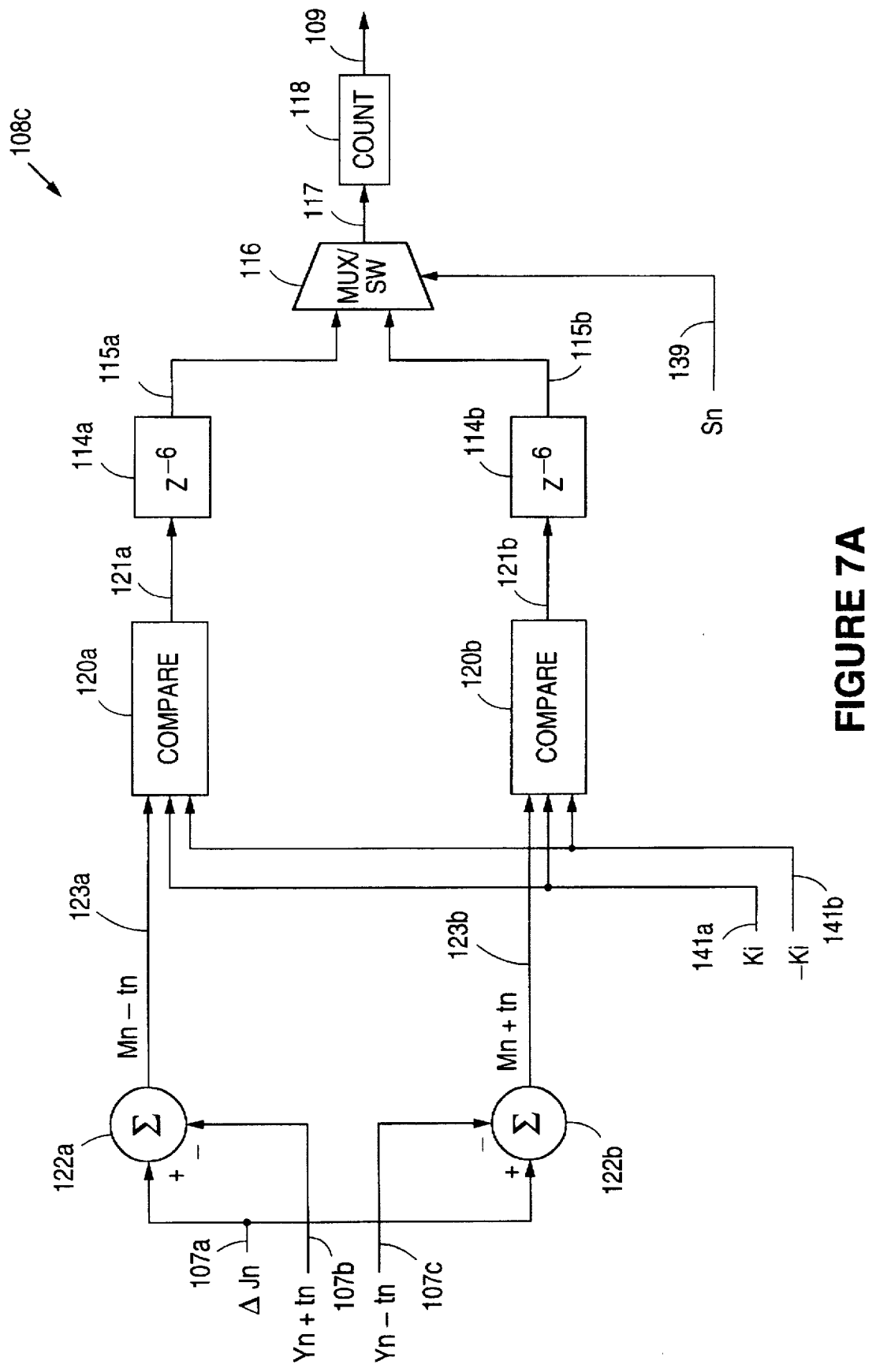
FIG. 7A is a functional block diagram of an evaluation circuit in accordance with still another embodiment of the present invention.

Referring to FIG. 7A, an evaluation circuit 108c in accordance with still another embodiment of the present invention includes, in accordance with the foregoing discussion, the signal summing circuits 122a, 122b, time delay elements 114a, 114b, signal selector 116 and counter 118, as in the first embodiment, but uses a pair of dual threshold comparison circuits 120a, 120b in place of the combinations of absolute value circuits 110a, 110b and single threshold comparison circuits 112a, 112b. Hence, the Viterbi decision metric and slicer threshold difference 123a and sum 123b signals are compared directly against both positive 141a and negative 141b versions of the statistic threshold $K_i$ signal. The resulting signals 121a, 121b are then time delayed and selected in accordance with the foregoing discussion.

Figure 7B:
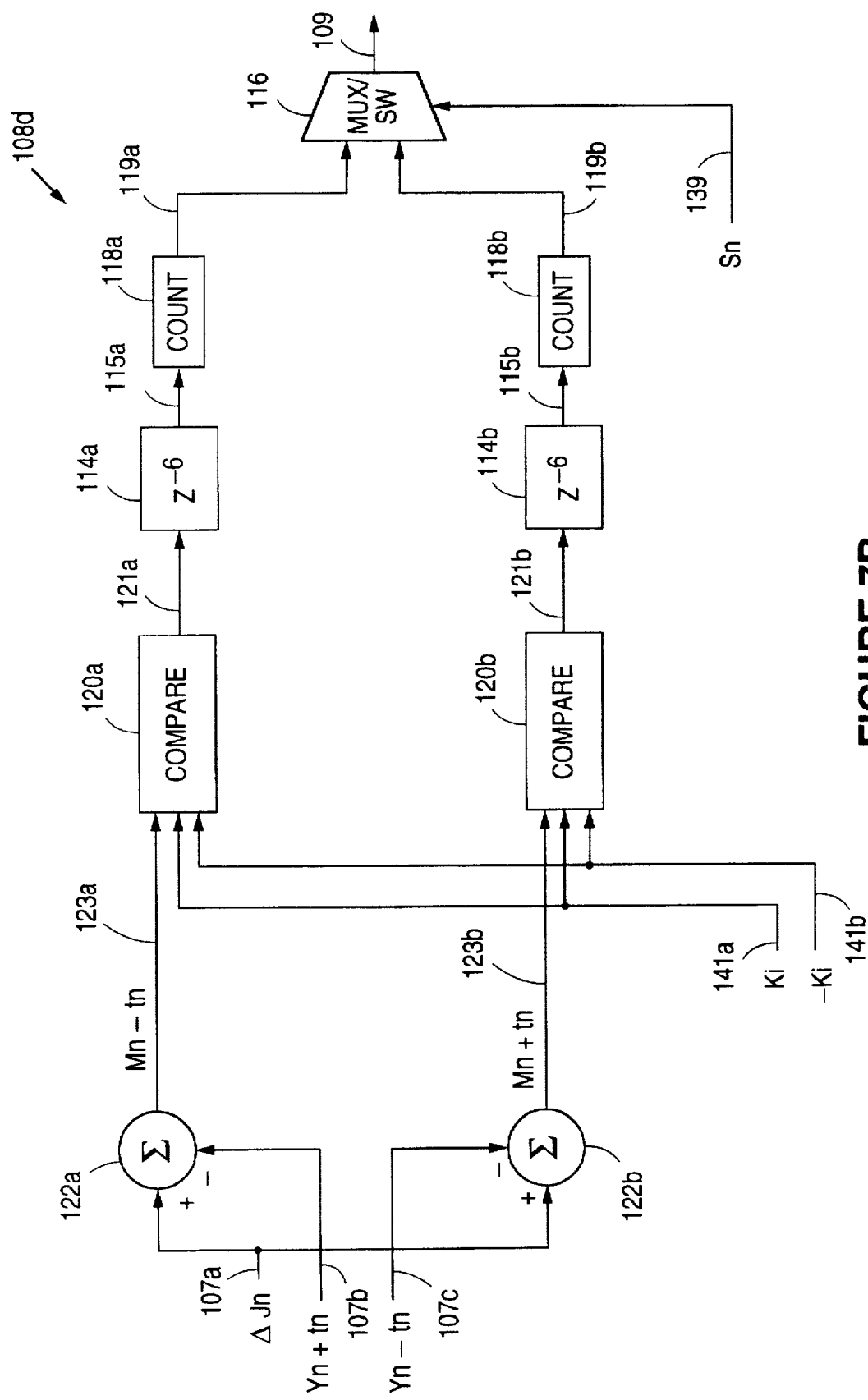
FIG. 7B is a functional block diagram of an evaluation circuit in accordance with yet another embodiment of the present invention.

Referring to FIG. 7B, an evaluation circuit 108d in accordance with yet another embodiment of the present invention, similar to the embodiment of FIG. 6B, uses two counters 118a, 118b preceding the signal selector 116. Hence, in accordance with the control signal 139, the appropriate count signal 119a, 119b is selected.

Figure 8:
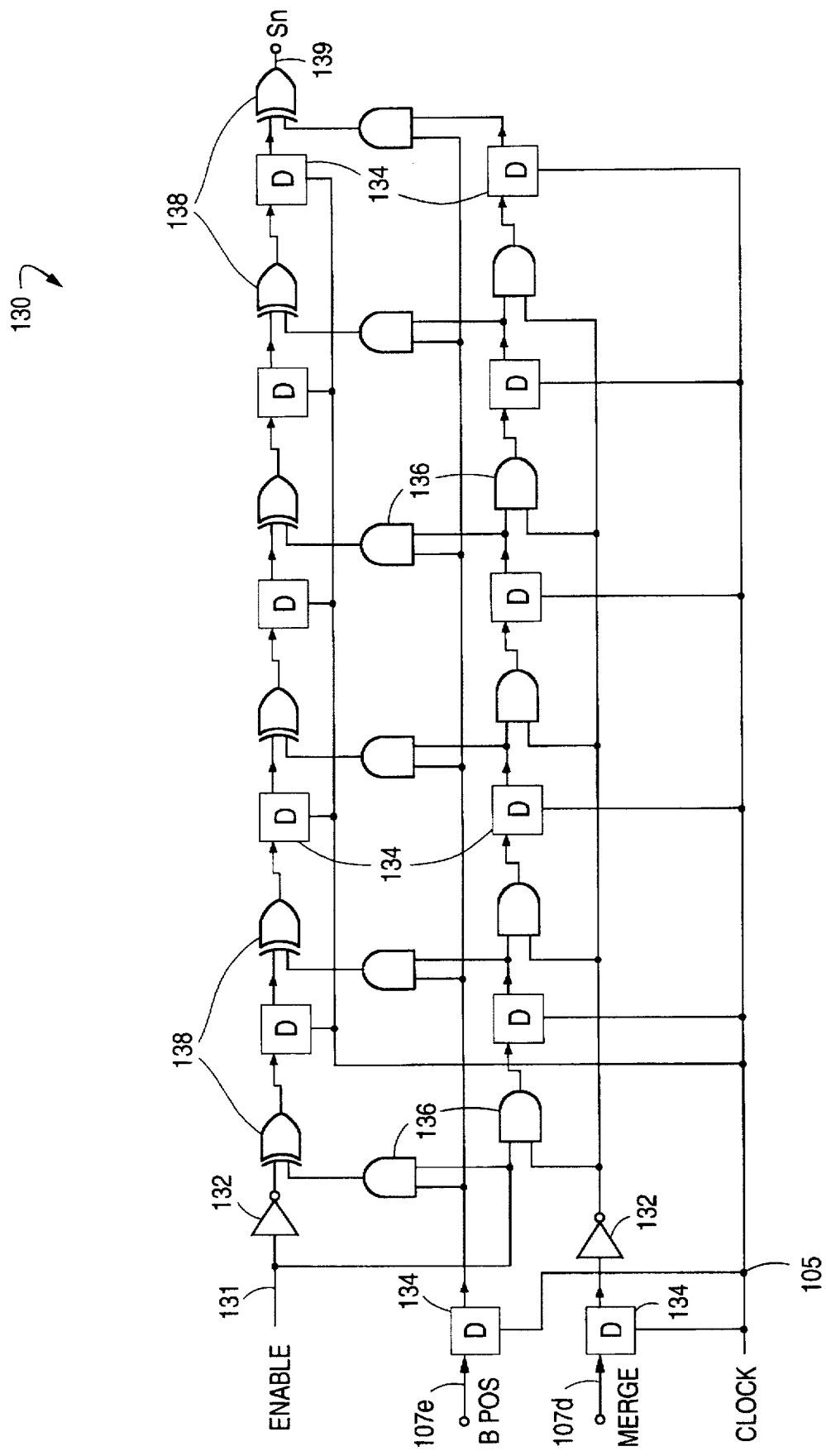
FIG. 8 is a logic diagram of a circuit for generating the signal selection control signal $S_n$ for the evaluation circuits of FIGS. 6A, 6B, 7A and 7B based upon postmerger information from the Viterbi detector.

Referring to FIG. 8, a circuit for generating the signal selection control signal $S_n$ 139 for the evaluation circuits of FIGS. 6A, 6B, 7A and 7B includes inverters 132, latches (e.g. D-type flip-flops) 134, AND gates 136 and exclusive-OR (XOR) gates 138, all interconnected substantially as shown. In accordance with the system clock signal 105 and an enable signal 131 (logic 1 to enable, logic 0 to disable), a b-positive signal 107d and a merge signal 107e, both of which are generated within the Viterbi detector 106 (FIG. 5), are latched and successively ANDed and XORed together and time-delayed to produce the selection control signal 139. The merge signal 107d corresponds to estimator signal $b_n^-$ (FIG. 2A) and indicates whether a merger has occurred within the trellis, while the b-positive signal 107e corresponds to estimator signal $b_n^+$ and indicates what type of merger has occurred (merger to state 0 if $b_n^+ = 0$, or merger to state 1 if $b_n^+ = 1$).

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an evaluation circuit for use in evaluating the bit error rate (BER) performance of a decoder with a Viterbi detector based upon a computation of its amplitude error margin (AEM), said evaluation circuit comprising:

a first threshold comparison circuit configured to receive and compare a first Viterbi signal and at least one AEM threshold signal and in accordance therewith generate a first comparison signal, wherein said first Viterbi signal represents a first combination of signals which includes a sum of a Viterbi difference metric signal and a Viterbi slicer threshold signal associated with a Viterbi detector;

a second threshold comparison circuit configured to receive and compare a second Viterbi signal and said at least one AEM threshold signal and in accordance therewith generate a second comparison signal, wherein said second Viterbi signal represents a second combination of signals which includes a difference between said Viterbi difference metric signal and said Viterbi slicer threshold signal, and further wherein said at least one AEM threshold signal corresponds to first and second probabilities that said first and second Viterbi signals have magnitudes which exceed first and second predetermined values, respectively; and a computation circuit, coupled to said first and second threshold comparison circuits, configured to receive a control signal and said first and second comparison signals and in accordance therewith compute at least one AEM parameter corresponding to at least one of said first and second Viterbi signals.

2. The apparatus of claim 1, wherein each one of said first and second threshold comparison circuits comprises:

a conversion circuit configured to convert said received Viterbi signal to an absolute value signal having a signal value which represents an absolute value of said received Viterbi signal;

a comparator, coupled to said conversion circuit, configured to receive and compare said absolute value signal with said at least one AEM threshold signal and in accordance therewith provide a compared value signal; and a delay circuit, coupled to said comparator, configured to receive and delay said compared value signal and in accordance therewith provide said comparison signal.

3. The apparatus of claim 2, wherein said delay circuit comprises a shift register.

4. The apparatus of claim 2, wherein said first threshold comparison circuit further comprises a first summing circuit configured to receive and differentially sum said Viterbi difference metric signal with a sum of a sample signal and said Viterbi slicer threshold signal and in accordance therewith provide said first Viterbi signal, and wherein said second threshold comparison circuit further comprises a second summing circuit configured to receive and differentially sum said Viterbi difference metric signal with a difference between said sample signal and said Viterbi slicer threshold signal and in accordance therewith provide said second Viterbi signal, and further wherein said sample signal represents a sample of an input signal to said Viterbi detector.

5. The apparatus of claim 1, wherein said at least one AEM threshold signal comprises first and second AEM threshold signals, and wherein said first AEM threshold signal corresponds to said first probability that said first Viterbi signal has a magnitude which exceeds said first predetermined value and said second AEM threshold signal corresponds to said second probability that said second Viterbi signal has a magnitude which exceeds said second predetermined value, and further wherein each one of said first and second threshold comparison circuits comprises:

a comparator configured to compare said received Viterbi signal with said first and second AEM threshold signals and in accordance therewith provide a compared value signal; and a delay circuit, coupled to said comparator, configured to receive and delay said compared value signal and in accordance therewith provide said comparison signal.

6. The apparatus of claim 5, wherein said delay circuit comprises a shift register.

7. The apparatus of claim 5, wherein said first threshold comparison circuit further comprises a first summing circuit configured to receive and differentially sum said Viterbi difference metric signal with a sum of a sample signal and said Viterbi slicer threshold signal and in accordance therewith provide said first Viterbi signal, and wherein said second threshold comparison circuit further comprises a second summing circuit configured to receive and differentially sum said Viterbi difference metric signal with a difference between said sample signal and said Viterbi slicer threshold signal and in accordance therewith provide said second Viterbi signal, and further wherein said sample signal represents a sample of an input signal to said Viterbi detector.

8. The apparatus of claim 1, wherein said at least one AEM parameter comprises first and second AEM parameters which correspond to said first and second Viterbi signals, respectively, and wherein said computation circuit comprises a signal selector configured to receive and select between said first and second comparison signals in accordance with said control signal and provide a selected comparison signal which represents said selected one of said first and second comparison signals, and further wherein said control signal indicates which one of said first and second AEM parameters is to be selected in accordance with a predetermined criterion.

9. The apparatus of claim 8, wherein said signal selector comprises a multiplexor.

10. The apparatus of claim 8, wherein said selected one of said first and second comparison signals includes a plurality of signal transitions, and wherein said computation circuit further comprises a counter, coupled to said signal selector, configured to count said plurality of signal transitions.

11. The apparatus of claim 1, wherein said first and second comparison signals include first and second pluralities of signal transitions, respectively, and wherein said computation circuit comprises first and second counters configured to count said first and second pluralities of signal transitions and in accordance therewith provide first and second count signals, respectively.

12. The apparatus of claim 11, wherein said at least one AEM parameter comprises first and second AEM parameters which correspond to said first and second Viterbi signals, respectively, and wherein said computation circuit further comprises a signal selector configured to receive and select between said first and second count signals in accordance with said control signal and provide a selected count signal which represents said selected one of said first and second count signals, and further wherein said control signal indicates which one of said first and second AEM parameters is to be selected in accordance with a predetermined criterion.

13. The apparatus of claim 12, wherein said signal selector comprises a multiplexor.

14. A partial response, maximum likelihood (PRML) decoder including an evaluation circuit for use in evaluating its bit error rate (BER) performance based upon a computation of its amplitude error margin (AEM), said PRML decoder comprising:

a pre-amplifier stage configured to receive and amplify an input signal;

a processing stage, coupled to said pre-amplifier stage, configured to receive and process said amplified input signal and to provide at least one AEM threshold signal, wherein said processing stage includes a Viterbi detector configured to provide first and second Viterbi signals in accordance with said processed amplified input signal, said Viterbi detector has a Viterbi difference metric signal and a Viterbi slicer threshold signal associated therewith, said first Viterbi signal represents a first combination of signals which includes a sum of said Viterbi difference metric signal and said Viterbi slicer threshold signal, said second Viterbi signal represents a second combination of signals which includes a difference between said Viterbi difference metric signal and said Viterbi slicer threshold signal, and said at least one AEM threshold signal corresponds to first and second probabilities that said first and second Viterbi signals have magnitudes which exceed first and second predetermined values, respectively;

a first threshold comparison stage, coupled to said processing stage, configured to receive and compare said first Viterbi signal and said at least one AEM threshold signal and in accordance therewith generate a first comparison signal;

a second threshold comparison stage, coupled to said processing stage, configured to receive and compare said second Viterbi signal and said at least one AEM threshold signal and in accordance therewith generate a second comparison signal;

a control circuit, coupled to said processing stage, configured to receive third and fourth Viterbi signals from said Viterbi detector and in accordance therewith provide a control signal which corresponds to a state of a merger as detected by said Viterbi detector; and a computation stage, coupled to said control circuit and said first and second threshold comparison stages, configured to receive said control signal and said first and second comparison signals and in accordance therewith compute at least one AEM parameter corresponding to at least one of said first and second Viterbi signals.

15. The decoder of claim 14, wherein each one of said first and second threshold comparison circuits comprises:

a conversion circuit configured to convert said received Viterbi signal to an absolute value signal having a signal value which represents an absolute value of said received Viterbi signal;

a comparator, coupled to said conversion circuit, configured to receive and compare said absolute value signal with said at least one AEM threshold signal and in accordance therewith provide a compared value signal; and a delay circuit, coupled to said comparator, configured to receive and delay said compared value signal and in accordance therewith provide said comparison signal.

16. The apparatus of claim 15, wherein said first threshold comparison circuit further comprises a first summing circuit configured to receive and differentially sum said Viterbi difference metric signal with a sum of a sample signal and said Viterbi slicer threshold signal and in accordance therewith provide said first Viterbi signal, and wherein said second threshold comparison circuit further comprises a second summing circuit configured to receive and differentially sum said Viterbi difference metric signal with a difference between said sample signal and said Viterbi slicer threshold signal and in accordance therewith provide said second Viterbi signal, and further wherein said sample signal represents a sample of an input signal to said Viterbi detector.

17. The decoder of claim 14, wherein said at least one AEM threshold signal comprises first and second AEM threshold signals, and wherein said first AEM threshold signal corresponds to said first probability that said first Viterbi signal has a magnitude which exceeds said first predetermined value and said second AEM threshold signal corresponds to said second probability that said second Viterbi signal has a magnitude which exceeds said second predetermined value, and further wherein each one of said first and second threshold comparison circuits comprises:

a comparator configured to compare said received Viterbi signal with said first and second AEM threshold signals and in accordance therewith provide a compared value signal; and a delay circuit, coupled to said comparator, configured to receive and delay said compared value signal and in accordance therewith provide said comparison signal.

18. The apparatus of claim 17, wherein said first threshold comparison circuit further comprises a first summing circuit configured to receive and differentially sum said Viterbi difference metric signal with a sum of a sample signal and said Viterbi slicer threshold signal and in accordance therewith provide said first Viterbi signal, and wherein said second threshold comparison circuit further comprises a second summing circuit configured to receive and differentially sum said Viterbi difference metric signal with a difference between said sample signal and said Viterbi slicer threshold signal and in accordance therewith provide said second Viterbi signal, and further wherein said sample signal represents a sample of an input signal to said Viterbi detector.

19. The decoder of claim 14, wherein said control circuit comprises a plurality of logic circuits configured to receive said third and fourth Viterbi signals and in accordance therewith provide said control signal, wherein said third and fourth Viterbi signals represent whether a merger has occurred and a type of said merger, respectively.

20. The decoder of claim 14, wherein said at least one AEM parameter comprises first and second AEM parameters which correspond to said first and second Viterbi signals, respectively, and wherein said computation circuit comprises a signal selector configured to receive and select between said first and second comparison signals in accordance with said control signal and provide a selected comparison signal which represents said selected one of said first and second comparison signals, and further wherein said control signal indicates which one of said first and second AEM parameters is to be selected in accordance with a predetermined criterion.

21. The decoder of claim 20, wherein said selected one of said first and second comparison signals includes a plurality of signal transitions, and wherein said computation circuit further comprises a counter, coupled to said signal selector, configured to count said plurality of signal transitions.

22. The decoder of claim 14, wherein said first and second comparison signals include first and second pluralities of signal transitions, respectively, and wherein said computation circuit comprises first and second counters configured to count said first and second pluralities of signal transitions and in accordance therewith provide first and second count signals, respectively.

23. The decoder of claim 22, wherein said at least one AEM parameter comprises first and second AEM parameters which correspond to said first and second Viterbi signals, respectively, and wherein said computation circuit further comprises a signal selector configured to receive and select between said first and second count signals in accordance with said control signal and provide a selected count signal which represents said selected one of said first and second count signals, and further wherein said control signal indicates which one of said first and second AEM parameters is to be selected in accordance with a predetermined criterion.

24. A method of evaluating the bit error rate (BER) performance of a decoder with a Viterbi detector based upon a computation of its amplitude error margin (AEM), said method comprising the steps of:

receiving and comparing a first Viterbi signal and at least one AEM threshold signal and in accordance therewith generating a first comparison signal, wherein said first Viterbi signal represents a first combination of signals which includes a sum of a Viterbi difference metric signal and a Viterbi slicer threshold signal associated with a Viterbi detector;

receiving and comparing a second Viterbi signal and said at least one AEM threshold signal and in accordance therewith generating a second comparison signal, wherein said second Viterbi signal represents a second combination of signals which includes a difference between said Viterbi difference metric signal and said Viterbi slicer threshold signal, and further wherein said at least one AEM threshold signal corresponds to first and second probabilities that said first and second Viterbi signals have magnitudes which exceed first and second predetermined values, respectively; and receiving a control signal and said first and second comparison signals and in accordance therewith computing at least one AEM parameter corresponding to at least one of said first and second Viterbi signals.

25. The method of claim 24, wherein each one of said steps of receiving and comparing a Viterbi signal and at least one AEM threshold signal and in accordance therewith generating a comparison signal comprises the steps of:

converting said received Viterbi signal to an absolute value signal having a signal value which represents an absolute value of said received Viterbi signal;

comparing said absolute value signal with said at least one AEM threshold signal and in accordance therewith generating a compared value signal; and delaying said compared value signal and in accordance therewith generating said comparison signal.

26. The method of claim 25, wherein said step of delaying said compared value signal and in accordance therewith generating said comparison signal comprises shifting said compared value signal with a shift register.

27. The method of claim 25, further comprising the steps of:

receiving and differentially summing said Viterbi difference metric signal with a sum of a sample signal and said Viterbi slicer threshold signal and in accordance therewith providing said first Viterbi signal, wherein said sample signal represents a sample of an input signal to said Viterbi detector; and receiving and differentially summing said Viterbi difference metric signal with a difference between said sample signal and said Viterbi slicer threshold signal and in accordance therewith providing said second Viterbi signal.

28. The method of claim 24, wherein said at least one AEM threshold signal comprises first and second AEM threshold signals, and wherein said first AEM threshold signal corresponds to said first probability that said first Viterbi signal has a magnitude which exceeds said first predetermined value and said second AEM threshold signal corresponds to said second probability that said second Viterbi signal has a magnitude which exceeds said second predetermined value, and further wherein each one of said steps of receiving and comparing a Viterbi signal and at least one AEM threshold signal and in accordance therewith generating a comparison signal comprises the steps of:

comparing said received Viterbi signal with said first and second AEM threshold signals and in accordance therewith generating a compared value signal; and delaying said compared value signal and in accordance therewith generating said comparison signal.

29. The method of claim 28, wherein said step of delaying said compared value signal and in accordance therewith generating said comparison signal comprises shifting said compared value signal with a shift register.

30. The method of claim 28, further comprising the steps of:

receiving and differentially summing said Viterbi difference metric signal with a sum of a sample signal and said Viterbi slicer threshold signal and in accordance therewith providing said first Viterbi signal, wherein said sample signal represents a sample of an input signal to said Viterbi detector; and receiving and differentially summing said Viterbi difference metric signal with a difference between said sample signal and said Viterbi slicer threshold signal and in accordance therewith providing said second Viterbi signal.

31. The method of claim 24, wherein said at least one AEM parameter comprises first and second AEM parameters which correspond to said first and second Viterbi signals, respectively, and wherein said step of receiving a control signal and said first and second comparison signals and in accordance therewith computing at least one AEM parameter corresponding to at least one of said first and second Viterbi signals comprises selecting between said first and second comparison signals in accordance with said control signal and generating a selected comparison signal which represents said selected one of said first and second comparison signals, and further wherein said control signal indicates which one of said first and second AEM parameters is to be selected in accordance with a predetermined criterion.

32. The method of claim 31, wherein said selected one of said first and second comparison signals includes a plurality of signal transitions, and wherein said step of receiving a control signal and said first and second comparison signals and in accordance therewith computing at least one AEM parameter corresponding to at least one of said first and second Viterbi signals further comprises counting said plurality of signal transitions.

33. The method of claim 24, wherein said first and second comparison signals include first and second pluralities of signal transitions, respectively, and wherein said step of receiving a control signal and said first and second comparison signals and in accordance therewith computing at least one AEM parameter corresponding to at least one of said first and second Viterbi signals comprises counting said first and second pluralities of signal transitions and in accordance therewith generating first and second count signals, respectively.

34. The method of claim 33, wherein said at least one AEM parameter comprises first and second AEM parameters which correspond to said first and second Viterbi signals, respectively, and wherein said step of receiving a control signal and said first and second comparison signals and in accordance therewith computing at least one AEM parameter corresponding to at least one of said first and second Viterbi signals further comprises selecting between said first and second count signals in accordance with said control signal and generating a selected count signal which represents said selected one of said first and second count signals, and further wherein said control signal indicates which one of said first and second AEM parameters is to be selected in accordance with a predetermined criterion.

* * * * *